United States Patent
Götz et al.

(10) Patent No.: US 7,713,594 B2
(45) Date of Patent: May 11, 2010

(54) METHOD OF APPLYING MATERIAL ON A COMPONENT AND COMPONENT

(75) Inventors: Knuth Götz, Mistelbach (DE); Robert Süß-Wolf, Nürnberg (DE); Marco De Paolis, Fürth (DE); Dieter Geist, Forchheim (DE)

(73) Assignee: Leoni Aktiengesellschaft, Nuremberg (DE)

( * ) Notice: Subject to any disclaimer, the term of this patent is extended or adjusted under 35 U.S.C. 154(b) by 528 days.

(21) Appl. No.: 11/645,829

(22) Filed: Dec. 26, 2006

(65) Prior Publication Data
US 2007/0154688 A1 Jul. 5, 2007

(30) Foreign Application Priority Data
Dec. 24, 2005 (DE) .................. 10 2005 062 271

(51) Int. Cl.
*B05D 3/00* (2006.01)
(52) U.S. Cl. .................. 427/553; 427/554; 427/555; 427/559; 427/427.3
(58) Field of Classification Search ........... 427/553, 427/554, 555, 559, 427.3
See application file for complete search history.

(56) References Cited

U.S. PATENT DOCUMENTS

| 2003/0136505 | A1* | 7/2003 | Wimmer et al. .......... 156/272.8 |
| 2004/0055153 | A1  | 3/2004 | Zahradnik et al. |
| 2006/0007552 | A1* | 1/2006 | Takakuwa et al. ........... 359/619 |
| 2006/0022586 | A1* | 2/2006 | Nelson et al. ............... 313/504 |
| 2006/0024504 | A1* | 2/2006 | Nelson et al. ............... 428/409 |
| 2006/0134918 | A1* | 6/2006 | Fujii et al. .................. 438/694 |
| 2006/0154468 | A1* | 7/2006 | Tanaka et al. ............... 438/613 |

FOREIGN PATENT DOCUMENTS

EP 1 363 811 B1 11/2003

OTHER PUBLICATIONS

Wikipedia, The Free Encyclopedia, "Thermoplastic", http://en.wikipedia.org/wiki/Thermoplastic; 3 pages, 2009.*

* cited by examiner

*Primary Examiner*—Binh X Tran
(74) *Attorney, Agent, or Firm*—Laurence A. Greenberg; Werner H. Stemer; Ralph E. Locher

(57) ABSTRACT

In order in particular to allow interconnects to be applied to a component (2) by a thermal spraying process in such a way that they are clearly delimited from one another, before the actual spraying process the surface (8) of the component (2) is treated, in particular laser treated, in such a way that a non-adhering region (14) with a nub-like surface structure is formed.

18 Claims, 3 Drawing Sheets

METHOD OF APPLYING MATERIAL ON A COMPONENT AND COMPONENT

BACKGROUND OF THE INVENTION

Field of the Invention

The invention relates to a method for applying material to a component in which the component is first treated, so that an adhering region and a non-adhering region are formed for the material, and in which the material is subsequently applied to the adhering region by a spraying process. The invention also relates to a component with material sprayed on its surface in an adhering region.

EP 1 363 811 B1 discloses such a method and such a component. The component serves here as a molded vehicle component. The sprayed-on material forms interconnects, which are consequently an integral part of the molded vehicle component. The material, in particular copper particles, is applied here by a thermal spraying process, in particular by means of what is known as flame spraying. To make a defined interconnect structure possible, it is envisaged here first to treat the surface of the molded component selectively in a way corresponding to an intended path of the interconnect, so that the surface has regions of different adhesion. Subsequently, in a two-stage method, a seed layer is first applied and then an interconnect is applied on this layer in the adhering region.

For a clear delimitation between interconnects that are adjacent one another, it is important here that the interconnects are formed by sharp contours and that the sprayed-on material is not "washed out" beyond these contours. It is decisive for this that, when the material is sprayed on, it reliably does not adhere in the non-adhering subregions of the surface, or can be easily removed again, since the particle jet impinging on the component surface during the thermal spraying is usually wider than the interconnect structure that is to be formed.

However, it has been found that particles are also to some extent deposited, and remain adhering, on the surface outside the prepared adhering regions, so that, apart from the actually intended interconnect path, additional clusters or artefacts may also form. Here there is the risk of an undesired electrical contact between two adjacent interconnects being formed via these artefacts.

In order to avoid this, sometimes masks or masking means are used, but they require considerable technical effort and are consequently also cost-intensive.

SUMMARY OF THE INVENTION

The invention is based on the object of making it possible to apply a material to a component, in particular by a thermal spraying process, in such a way that sharp-edged structures of the sprayed-on material are reliably formed.

The object is achieved according to the invention by a method for applying material to a component according to patent claim 1. This provides that, before the material is sprayed onto the surface of the component, the latter is subdivided by a controlled surface treatment into an adhering region and a non-adhering region, a nub-like surface structure being formed in the non-adhering region.

The reason for this is that studies have shown that the nub-like surface structure has the effect that reliable non-adherence of the material is achieved in this region. A nub-like surface structure is understood here as meaning a structure which has approximately punctiform elevations as individual nubs. These nubs are formed here in particular in the manner of hemispheres, so form a spherically curved surface.

Such a structured surface exhibits extremely low adhesion and extremely low wettability for the sprayed-on material. It is in this case assumed that this effect is comparable to the lotus effect, that is to say that extremely low wettability is achieved by this specific structuring of the surface, or that the individual particles impinging on the surface only form a very great contact angle in relation to it. On account of this low adhesiveness, unwanted deposits on the surface, that is to say artefacts or clusters, are avoided. As a result, structures, in particular interconnect structures, with clearly delimited edge regions can be formed by the subsequent spraying operation.

The nub-like surface structure is preferably produced here by means of a laser treatment. A sharp delimitation between the adhering region and the non-adhering region is possible without any problem by using a laser.

A pulsed laser is also preferably used to form the nub-like structure. The impingement of the individual laser pulses with high energy on the surface has the effect that a respective nub is produced when the respective laser pulse impinges. The high energy density of the laser pulse has the effect that a very high level of heat is introduced locally and, in particular when a plastic component is used, nubs similar to small blisters form.

According to an expedient development, the surface structure is formed here in such a way that the nubs are adjoined by untreated surface regions. The reason for this is that studies have shown that this measure has a positive influence on the effect of low adhesion. The nubs are therefore arranged singly, at least in one direction of extent of the surface, i.e. they are in particular at a defined distance from one another.

The proportion of untreated surface regions is expediently approximately 20% to 60%, and in particular approximately 40%, of the overall surface of the non-adhering region.

With preference, the nubs form a uniform pattern, that is to say are not chaotically or randomly distributed over the surface. Rather, they form recurring structures and symmetries; they are for example arranged at defined distances from one another, it being possible for the distances to be different in different directions. In a preferred variant, it is provided for example that the nubs in a first direction are in each case directly adjacent one another, so that they touch and form individual rows, the individual rows of nubs being spaced apart from one another by for example one nub diameter or up to 50 µm. According to a preferred second refinement, by contrast the nubs are arranged in a grid-like manner, i.e. the individual nubs are respectively surrounded on all sides by an untreated surface region and the individual nubs form the grid points of a grid. Here, the nubs are in particular at equal distances from the adjacent nubs of approximately 10 µm-90 µm.

Furthermore, the nubs preferably have a diameter of up to approximately 90 µm. At the same time, the height of the nubs is expediently up to approximately 30 µm and lies in particular in the range of approximately 5 µm.

In order to achieve particularly good adhesion in the adhering region, it is preferably provided that the adhering region is also surface-treated. As a difference from the surface region of the non-adhering region, according to an expedient refinement it is provided here that, in the adhering region, the surface is treated over its full surface area. It has been found that treatment over the full surface area has a positive effect for the adhesion. In particular, the surface roughness is increased in comparison with the original state by the surface treatment of the adhering region, in order in this way to ensure better adhesion of the sprayed-on particles on the surface.

In order to achieve this, in a preferred refinement it is provided that furrows, that is to say elongate, linear depressions, are formed in the adhering region, with elevations forming between them. The depth of these furrows preferably lies here in the range of the height of the nubs. The furrows are formed here—in comparison with the forming of the nub-like structure—by the laser continuously irradiating the surface and, in particular, also a higher amount of energy being introduced than when the nub-like surface structure is formed.

In an advantageous refinement of the method, the surface treatment is carried out in a controlled manner in such a way that both the adhering region and the non-adhering region are formed in just one working step. In other words, when a laser is used, it is successively guided over the component, for example in a linear manner. Here, the laser is activated differently when it passes over the adhering region to be formed than when it passes over the non-adhering region to be formed. This measure therefore makes it possible even to produce complex path or interconnect structures by the activation of the laser alone.

Preferably, with the surface treatment, the surface is also at the same time cleaned of contaminants. This measure therefore means that there is no longer any need for a subsequent working step to remove for example oily deposits on the surface, or other contaminants, that would adversely influence the subsequent adhesion of the sprayed particles.

A thermoplastic, with preference a polyamide or a polypropylene, is used in particular as the surface material of the component. In the case of thermoplastics, in particular polyamide or polypropylene, the forming of a nub-like structure by laser treatment is possible without any problem. On the other hand, in particular in conjunction with a selected spray material, in particular a metallic spray material, preferably copper, these materials exhibit particularly good interaction to the extent that the sprayed-on material does not remain adhering on the surface in the non-adhering regions.

The object is also achieved according to the invention by a component with the features of claim 16. The advantages and preferred refinements presented with regard to the method can also be transferred analogously to the component.

Exemplary embodiments of the invention are explained in more detail below on the basis of the figures respectively showing schematic, sometimes greatly simplified representations, in which:

DESCRIPTION OF THE PREFERRED EMBODIMENTS

Figure 1:
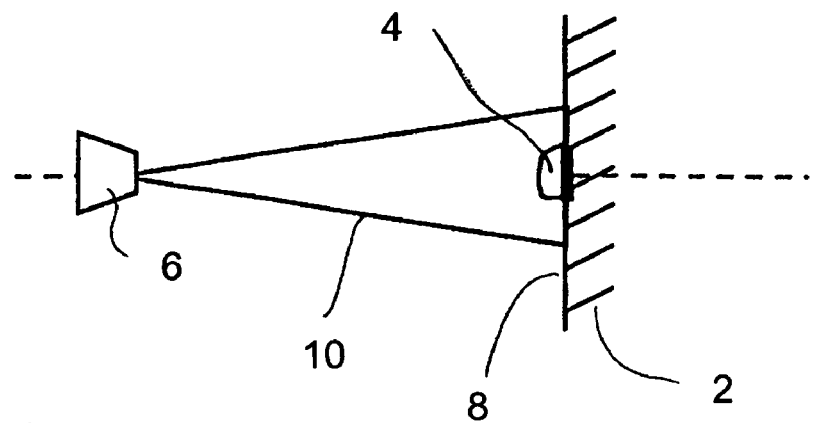
FIG. 1 shows a representation of the method for applying material to a component by means of a thermal spraying process.

According to the greatly simplified and schematized representation of the application method according to claim 1, material 4, in particular copper or a copper alloy, is sprayed onto a component 2 by means of a thermal spraying process. Thermal spraying as described and defined in DIN EN657 is understood here as the spraying process. In particular, what is known as flame spraying is used for spraying on the material 4. This involves using a flame spraying nozzle 6 to spray the material 4, prepared as individual particles, onto the surface 8 of the component 2 together with a carrier gas. The particles form a jet cone 10 together with the carrier gas, which is usually an inert gas. The diameter or width of said cone is generally greater here than the structure to be formed on the surface 8.

In order to produce discrete and sharply delimited structures, in particular interconnect structures, reliably here, the surface 8 is suitably pretreated, so that regions of different adhesion are selectively formed in a way corresponding to the desired path of the structures to be applied.

In the case of the method described here, the entire surface 8 is treated by means of a laser. This involves the regions of different adhesion being formed by different laser treatment. This different laser treatment is performed by choosing different operating parameters, such as for example traversing speed of the laser, energy density of the laser, geometry of the focal spot of the laser, etc.

Figure 2:
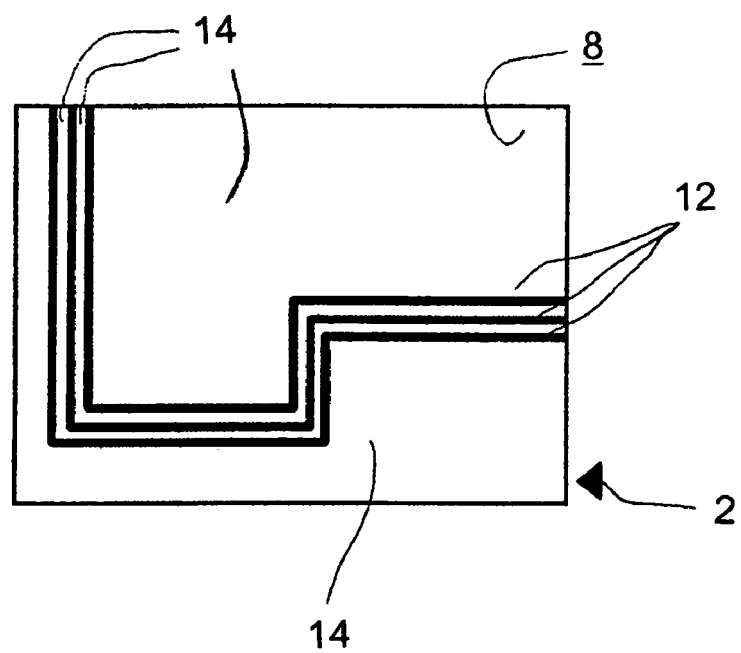
FIG. 2 shows a plan view of a component with path-like structures.

With such a controlled laser treatment, adhering regions 12 and non-adhering regions 14 can therefore be formed and sharply delimited from one another on the surface 8 without any problem and in only one method step. This is schematically illustrated in FIG. 2, individual adhering regions 12 being formed here in the manner of paths. In the subsequent spraying, the particles are deposited on these adhering regions 12 and consequently build up a conductive layer, which is delimited with respect to the adjacent conductive layers. Consequently, electrically conductive interconnects are formed, applied directly to the component 2 and constituting part of the same.

The component 2 is, for example, a molded component for a motor vehicle, for example a door module, a dashboard, a roof liner, etc. In principle, however, application of the method described here is not only restricted to components for the motor vehicle sector and is not only suitable for producing interconnect structures. The method serves quite generally for producing discrete, sharply delimited sprayed-on structures. Metallic material, in particular copper or a copper alloy, is used here in particular as the spray material. The component 2 consists in particular of a thermoplastic material, with preference of polyamide or polypropylene. At least the surface 8 of the component 2 consists of this material.

The forming of the non-adhering regions 14 in particular makes the use of masks or other masking means unnecessary and it is also preferred that they are not provided.

For producing the non-adhering regions 14, in these regions the surface 8 is treated by means of a pulsed laser, so that altogether a nub-like surface structure is obtained. This nub-like surface structure can be seen from FIG. 3 and FIG. 4, left-hand half of the illustration, the two micrographs having been taken with different magnifications. The pulsed laser treatment creates individual discrete nubs 16, that is to say elevations formed in the manner of hemispheres, on the surface 8. The pulsed laser treatment with the introduction of a high level of energy has the effect that the surface material is strongly heated briefly and in a punctiform manner, so that the individual nubs 16 form locally in the manner of small blisters. The parameters for the laser treatment are in this case set such that the nubs have approximately a diameter of 10 μm to 90 μm. The height of the nubs lies between approximately 5 μm and 30 μm.

Figure 3:
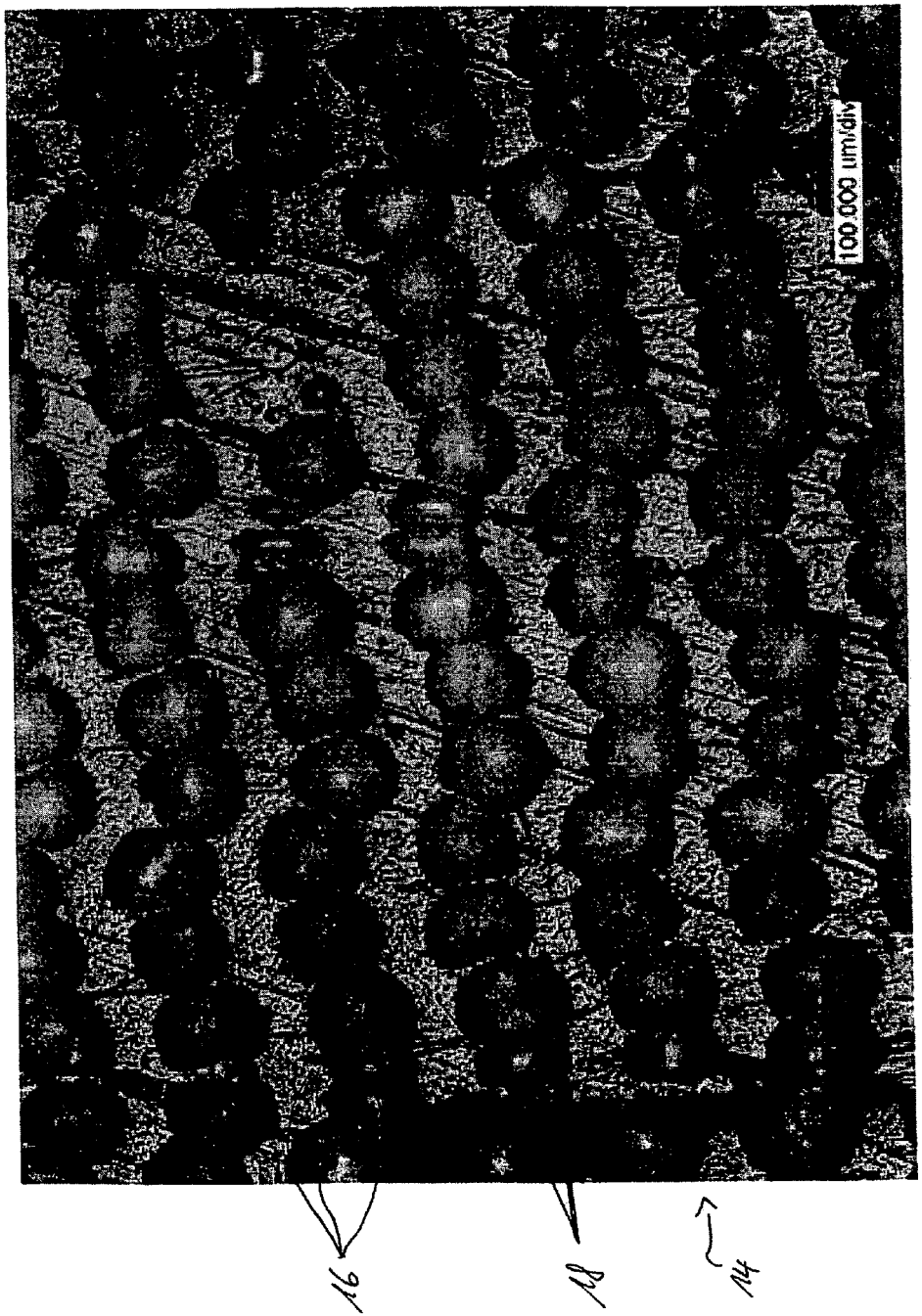
FIG. 3 shows a microscopically enlarged representation of a non-adhering surface region with a nub-like surface structure and FIG. 4 shows a microscopically enlarged representation of a surface with a non-adhering region with a nub-like surface structure and, adjoining this region, an adhering region.

In the exemplary embodiment of FIG. 3, the individual nubs 16 are in a row directly next to one another in the longitudinal direction, that is to say they touch. By contrast, in the exemplary embodiment of FIG. 4, a grid-like nub structure is formed, in which the nubs are respectively arranged singly. The nubs 16 adjacent one another according to FIG. 3 therefore form rows of nubs, which do not necessarily have to run in a strictly straight line but may also run in a sinuous or arcuate line. Both surface structures have a uniform symmetrical distribution of the individual nubs 16. In the case of FIG. 3, for example, the distance between two adjacent rows of nubs is the same in each case. Therefore, an equal grid spacing is provided between the individual rows of nubs. Conversely, it is also the case in the exemplary embodiment according to FIG. 4 that a constant grid spacing is formed both in the longitudinal direction and in the transverse direction.

In both cases, it is of particular importance that between the individual nubs 16 there are untreated surface regions 18, that is to say regions which are not influenced by the laser treatment. These untreated surface regions 18 are the regions between the individual nubs 16. The proportion of the untreated surface region 18 is, in particular, approximately 40% of the overall surface in the non-adhering region 14. In other words, the nubs 16 cover approximately 60% of the surface region 18. In the case of the configurational variant of FIG. 4 with the grid-like arrangement, this ratio is approximately reversed, and the nubs 16 cover approximately 40% of the surface region 18.

Figure 4:
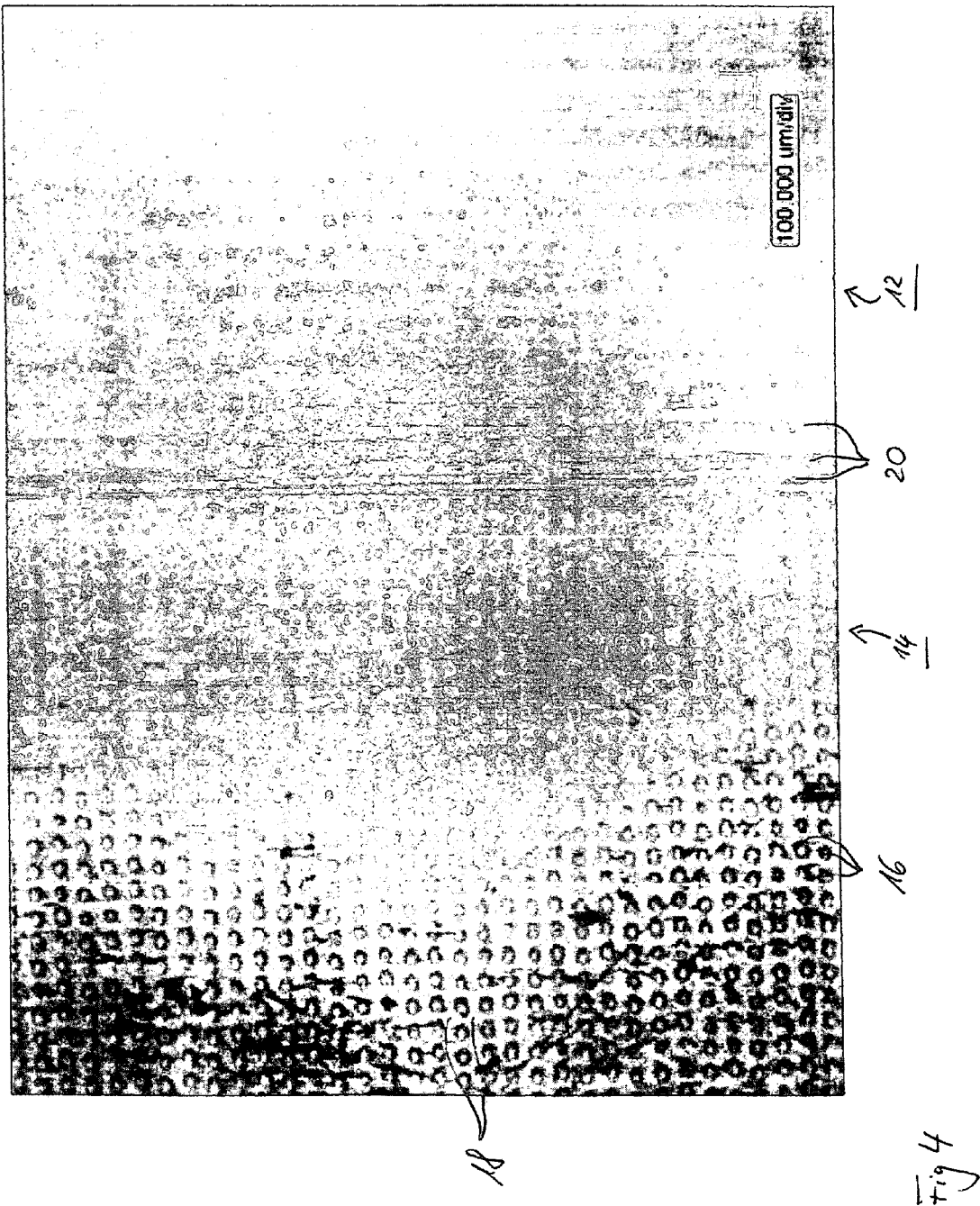

As can be seen from FIG. 4, the non-adhering region 14 is adjoined in a sharply delimited manner by the adhering region 12. With preference, the latter is likewise laser-treated. As a difference from the non-adhering region 14, however, it is treated over its full surface area, so that the entire surface is therefore changed by the laser treatment. In the exemplary embodiment, the adhering region 12 has linear, continuous structures in the manner of trenches or furrows 20, between which there are elevations 22 in the manner of waves. This measure has the effect that a defined surface roughness is formed in the adhering region 12 and helps the adhesion of the material 4 to the adhering region 12. The individual furrows 20 are spaced apart from one another here—in a way similar to the individual rows of nubs—in the micrometer range and are at a distance of up to approximately 50 µm from one another. The difference in height between the lowest point of the furrows 20 and the highest point of the elevation 22 likewise lies in the range of approximately 10 µm to 50 µm. The width of the furrows lies approximately in the range up to 20 µm.

Altogether, therefore, the surface 8 is provided both in the non-adhering region 14 and in the adhering region 12 with a microstructure, that is to say with structures of which the characteristic variables, such as for example the distance from one another, etc., are <100 µm and in particular <50 µm. This microstructure and, in particular the nub-like microstructure in the non-adhering region 14, achieves the effect of a clear and sharp delimitation of the sprayed-on material 4 with respect to the adjacent surface regions.

We claim:

1. A method for applying particle material to a component, the method which comprises:
    defining a non-adhering region and an adhering region of a surface of the component;
    treating the non-adhering region of the surface of the component by a controlled surface treatment to form a nub surface structure formed with nubs in the non-adhering region; and
    subsequently applying the particle material to the adhering region with a spraying process.

2. The method according to claim 1, which comprises forming the nubs in a substantially uniform pattern.

3. The method according to claim 1, which comprises forming the nubs with a diameter of approximately 10 µm-90 µm.

4. The method according to claim 1, which comprises forming the nubs with a height of up to approximately 30 µm.

5. The method according to claim 1, which comprises forming the nubs with a height of approximately 5 µm.

6. The method according to claim 1, which comprises subjecting the surface in the adhering region substantially to a full surface area treatment.

7. The method according to claim 1, which comprises forming furrows in the adhering region.

8. The method according to claim 1, which comprises controlling the surface treatment in a controlled process and forming the adhering region and the non-adhering region in a single working step.

9. The method according to claim 1, wherein the surface treatment is configured to also clean the surface of contaminants.

10. The method according to claim 1, which comprises forming the adhering region within a defined, delimited path structure.

11. The method according to claim 1, which comprises forming electrical interconnects with the sprayed-on material.

12. The method according to claim 1, wherein the treating step comprises producing the nub surface structure by way of a laser treatment.

13. The method according to claim 12, which comprises employing a pulsed laser to form individual nubs of the surface structure by respectively impinging laser pulses.

14. The method according to claim 1, wherein the surface of the component is formed with a thermoplastic surface material.

15. The method according to claim 14, wherein the thermoplastic surface material is polyamide or polypropylene.

16. The method according to claim 1, wherein the nub surface structure includes nubs adjoined by untreated surface regions.

17. The method according to claim 16, wherein a proportion of untreated surface regions is approximately 20% to 60% of an overall surface of the non-adhering region.

18. The method according to claim 16, wherein a proportion of untreated surface regions is approximately 40% of an overall surface of the non-adhering region.

* * * * *